(12) United States Patent
Vålberg et al.

(10) Patent No.: US 11,868,155 B2
(45) Date of Patent: Jan. 9, 2024

(54) CONTROL PANEL SYSTEM IN AN AGRICULTURAL MACHINE

(71) Applicant: VÄDERSTAD HOLDING AB, Väderstad (SE)

(72) Inventors: Stefan Vålberg, Linköping (SE); Johan Söderberg, Linköping (SE)

(73) Assignee: VÄDERSTAD HOLDING AB, Väderstad (SE)

( * ) Notice: Subject to any disclaimer, the term of this patent is extended or adjusted under 35 U.S.C. 154(b) by 53 days.

(21) Appl. No.: 17/438,916

(22) PCT Filed: Mar. 11, 2020

(86) PCT No.: PCT/EP2020/056425
§ 371 (c)(1),
(2) Date: Sep. 13, 2021

(87) PCT Pub. No.: WO2020/182847
PCT Pub. Date: Sep. 17, 2020

(65) Prior Publication Data
US 2022/0187927 A1  Jun. 16, 2022

(30) Foreign Application Priority Data
Mar. 13, 2019 (SE) .................................. 1950319-2

(51) Int. Cl.
*G08C 17/04* (2006.01)
*G06F 3/02* (2006.01)
(Continued)

(52) U.S. Cl.
CPC ............ *G06F 3/023* (2013.01); *G06F 3/0202* (2013.01); *G08C 17/04* (2013.01)

(58) Field of Classification Search
None
See application file for complete search history.

(56) References Cited

U.S. PATENT DOCUMENTS 5,579,002 A * 11/1996 Iggulden ............... G06F 3/0219
341/23
5,729,222 A * 3/1998 Iggulden ............ H03K 17/9631
250/221

(Continued)

FOREIGN PATENT DOCUMENTS

GB  2515127 A  12/2014

OTHER PUBLICATIONS

International Search Report dated Jun. 5, 2020, issued in corresponding International Patent Application No. PCT/EP2020/056425, filed Mar. 11, 2020, 2 pages.

*Primary Examiner* — Curtis A Kuntz
*Assistant Examiner* — Jerold B Murphy
(74) *Attorney, Agent, or Firm* — Davis Wright Tremaine LLP

(57) ABSTRACT

A configurable control panel system (10) for an agricultural machine, the system comprising: one or more pre-coded pushbuttons (1), each push button having a code mechanism adapted to carry a specific code representing a dedicated function for the push button; a control panel (5) provided with one or more sockets (7) adapted to receive and detachably attach any one of said pre-coded push buttons (1), each socket having a decoding mechanism adapted to generate a code specific control signal based on the code carried by the pre-coded push button when the push button is actuated.

20 Claims, 5 Drawing Sheets

(51) Int. Cl.
*G05B 19/409* (2006.01)
*H03K 17/972* (2006.01)
*G06F 3/023* (2006.01)

(56) References Cited

U.S. PATENT DOCUMENTS

| | | | |
|---|---|---|---|
| 6,650,254 B1* | 11/2003 | Rix | G06F 3/0202 |
| | | | 341/26 |
| 2005/0017581 A1* | 1/2005 | Kelwaski | H01H 23/30 |
| | | | 307/10.1 |
| 2007/0108034 A1* | 5/2007 | Rix | G06F 3/0202 |
| | | | 200/520 |
| 2009/0040074 A1 | 2/2009 | Mctavish | |
| 2016/0266658 A1* | 9/2016 | Chang | G06F 3/0238 |

\* cited by examiner

CONTROL PANEL SYSTEM IN AN AGRICULTURAL MACHINE

CROSS-REFERENCE TO RELATED APPLICATIONS

The present disclosure is a 371 U.S. National Phase of International Patent Application No. PCT/EP2020/056425, filed Mar. 11, 2020, entitled "CONTROL PANEL SYSTEM IN AN AGRICULTURAL MACHINE," which claims priority to Swedish Patent Application No. 1950319-2, filed Mar. 13, 2019, entitled "CONTROL PANEL SYSTEM IN AN AGRICULTURAL MACHINE," the contents of which are incorporated herein by reference in their entirety.

The present disclosure relates generally to control panel systems for agricultural machines, such as multi-row precision seed drills or planters. More specifically, the present disclosure relates to a control panel system that enables an operator of an agricultural machine to configure a control panel with selectable control button functions and selectable position of the control button functions on the control panel.

BACKGROUND

Agricultural machines, such as seed drills, planters or cultivators designed to be towed by a towing vehicle such as a tractor used to be provided with simple electrical or electronic control systems. However, in pace with technological development in agriculture and other technical areas, the electronics in agricultural machines have acquired an increasingly central role. Gradually, control systems have been developed by individual manufacturers as well as standardised protocols, for example ISOBUS. In pace with the general trends in electronics, the development of specific software for agricultural management and agricultural machines being provided with an increasing variety of electronically controllable functions, there are also increasingly high demands on electronics for the control, monitoring and manoeuvring of agricultural machines.

Typically, control panels in the agricultural field has a number of control actuators like push button keys, touch buttons or the like, where each control actuator activates a specific desired function. The demands described above contributes to control panels for agricultural machines being provided with a large number of control actuators like push buttons, touch screens and other user interfaces, related to executing a large number of different functions. As a consequence agricultural machine manufacturers tend to provide general control panels that are devised to fit with several different types of agricultural machines, or to fit with specific tasks in performed with an agricultural machine in a certain work session. Alternatively, the manufacturers provided a number of specialised control panels each fitting a specific type of machine resulting in inefficiencies due to many product variants.

A problem with control panels for agricultural machines being present in the driver cab of the tractor is that not all functions are needed for a working task to be performed with a specific machine during a working session. This results in a large number of un-used control actuators being present in the driver cab of the tractor at any given work session. The tractor is often used for a number of different agricultural implements whereby the driver environment often is cluttered with a number of controls, panels and screens although needed and desirable, but not all needed at the same time.

CN 203 194 247 shows an intelligent soilless cultivation control panel, which aims to solves the problem that existing display panels cannot be used for mode selection. The intelligent soilless cultivation control panel mode selecting component is arranged on a control panel and comprises a touch display device capable of displaying real-time detection values of environment factors and carrying out mode selection. One side of a touch display device is provided with a dynamic parameter indicator. Although the disclosed control panel has the capability of controlling and adjusting environment factors in real time and conveniently carrying out desired cultivation mode selection, or running mode selection, it has the disadvantage of a non-flexible control panel being provided with a huge number of controls and buttons. Thus, the control panel will be large and bulky, and there will be a lot of controls present needed for some tasks to be performed but not needed for other tasks.

Thus, there is a need for a flexible solution for enabling control panels for agricultural machines to be adapted for a current task to be performed.

SUMMARY

The problem described above is addressed by the claimed configurable control panel system for an agricultural machine. The configurable control panel system of the present disclosure enables a user to configure the disposition of push button control actuators with selectable control function and selectable position on a control panel.

According to a first aspect, a configurable control panel system for an agricultural machine system comprises:
  one or more pre-coded push buttons, each push button having a code mechanism adapted to carry a specific code representing a dedicated function for the push button; and
  a control panel provided with one or more sockets adapted to receive and detachably attach any one of said pre-coded push buttons, each socket having a decoding mechanism adapted to generate a code specific control signal based on the code carried by the pre-coded push button when the push button is actuated.

According to further aspects, the configurable control panel system comprises the following features:
  A control processor adapted to receive the code specific control signal and to activate a predetermined function of the agricultural machine coupled to the specific code.
  The code mechanism of each pre-coded push button comprises one or more magnets configured in a magnet pattern to form said specific code; the decoding mechanism of each socket in the control panel comprises one or more magnetic field sensors adapted to detect the magnet pattern of an attached pre-coded push button when the push button is actuated; and the code specific control signal is generated based on the output signals of said magnetic field sensors.
  The magnets are of the same magnetic strength and said magnet pattern is provided by the presence, the absence and/or the orientation of the magnets mounted at predetermined positions of the push button.
  The magnets are of different magnetic strength and said magnet pattern is provided by the differences in strength of the magnets mounted at predetermined or selectable positions of the push button.
  The one or more magnetic field sensors of the decoding mechanism are mounted in the one or more sockets at predetermined positions corresponding to positions of the one or more magnets of the code mechanism in each pre-coded push button when attached to a socket; and said one or more magnetic field sensors are arranged to detect the magnetic field of a corresponding magnet of an attached pre-coded push button when the push button is actuated.

Each of said one or more magnetic field sensors is adapted to deliver an electric signal in response to the detection of a magnetic field such that the code carried by the magnet pattern of the push button is transformed into one or more electric signals used to generate said code specific control signal.

The control panel comprises a first part and a second part that is provided with one or more of said sockets for pre-coded push buttons; said second part is detachable from the first part; and the first part and the second part are adapted for wireless or wired communication when detached from each other.

The configurable control panel system is adapted to generate a code specific control signal in the form of a binary code.

The one or more magnetic field sensors is adapted to: determine the magnetic field polarity of a corresponding magnet of an attached pre-coded push button; or to determine the strength of a corresponding magnet of an attached pre-coded push button.

According to other aspects, pre-coded push button for a configurable control panel for an agricultural machine, comprises a selection of:

A code mechanism adapted to carry a specific code representing a dedicated function for the push button; and being adapted to detachably attach to any one of one or more sockets of a control panel.

The code mechanism comprises one or more magnets configured in a magnet pattern to form said specific code.

The magnets are of the same magnetic strength and said magnet pattern is provided by the presence, the absence and/or the orientation of the magnets mounted at predetermined positions of the push button.

The magnets are of different magnetic strength and said magnet pattern is provided by the differences in strength of the magnets mounted at predetermined or selectable positions of the push button.

According to a further aspect, a set of pre-coded push buttons for a configurable control panel for an agricultural machine, comprises a plurality of pre-coded push buttons each having a code mechanism adapted to carry a specific code representing a dedicated function for the push button and being adapted to detachably attach to any one of one or more sockets of a control panel. The pre-coded push buttons pre-coded of the set may be provided with a unique code within the set and wherein each respective code is coupled to a unique function to be activated on the agricultural machine when the push button is actuated.

According to an aspect, a configurable control panel for an agricultural machine, comprises a selection of:

One or more sockets each adapted to receive and detachably attach a pre-coded push button, each socket having a decoding mechanism adapted to generate a code specific control signal based on the code carried by the pre-coded push button when the push button is actuated.

A control processor adapted to receive the code specific control signal and to activate a predetermined function of the agricultural machine coupled to the specific code.

The decoding mechanism of each socket in the control panel comprises one or more magnetic field sensors adapted to detect the magnet pattern of an attached pre-coded push button when the push button is actuated; the code specific control signal is generated based on the output signals of said magnetic field sensors.

The one or more magnetic field sensors of the decoding mechanism are mounted in the one or more sockets at predetermined positions corresponding to positions of the one or more magnets of the code mechanism in each pre-coded push button when attached to a socket; and said one or more magnetic field sensors are arranged to detect the magnetic field of a corresponding magnet of an attached pre-coded push button when the push button is actuated.

Each of said one or more magnetic field sensors is adapted to deliver an electric signal in response to the detection of a magnetic field such that the code carried by the magnet pattern of the push button is transformed into one or more electric signals used to generate said code specific control signal.

The control panel comprises a first part and a second part that is provided with one or more of said sockets for pre-coded push buttons; said second part is detachable from the first part; and the first part and the second part are adapted for wireless or wired communication when detached from each other.

The configurable control panel is adapted to generate a code specific control signal in the form of a binary code.

The one or more magnetic field sensors is adapted to determine the magnetic field polarity of a corresponding magnet of an attached pre-coded push button or to determine the strength of a corresponding magnet of an attached pre-coded push button.

Further aspects of embodiments are described in the detailed description.

BRIEF DESCRIPTION OF THE DRAWINGS

Embodiments of the present description are further explained below in conjunction with the enclosed drawings, wherein.

Embodiments of the present disclosure and their advantages are best understood by referring to the detailed description that follows. It should be appreciated that like reference numerals are used to identify like elements illustrated in one or more of the figures.

DETAILED DESCRIPTION

The present disclosure relates to a configurable control panel system for an agricultural machine. Embodiments of the disclosure are presented in more detail with reference to the figures of the enclosed drawings.

Figure 1:
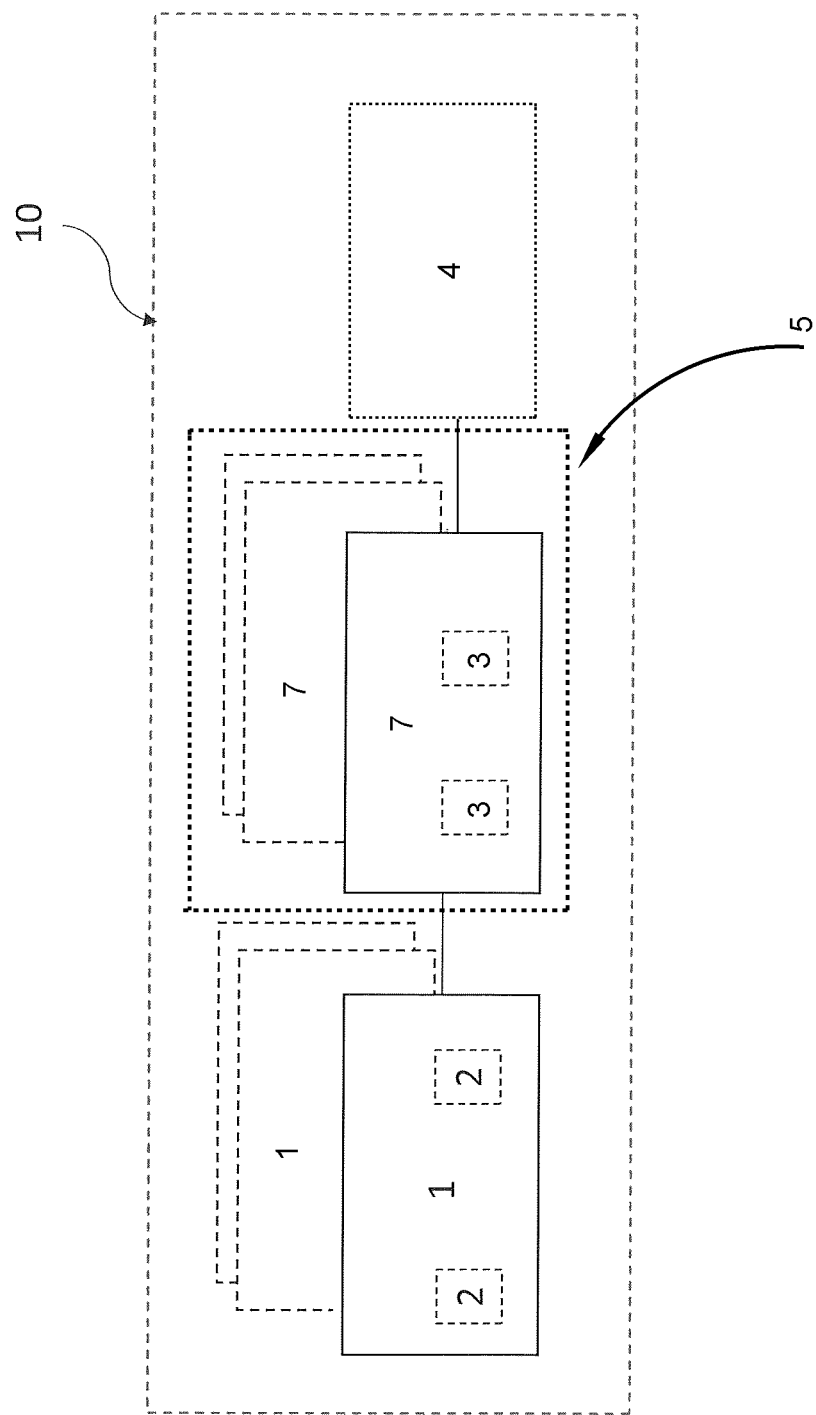
FIG. 1 shows schematically an exemplifying embodiment of a configurable control panel system in accordance with the present disclosure.

FIG. 1 shows an embodiment of a configurable control panel system 10 for an agricultural machine. The control panel system 10 comprises one or more pre-coded push buttons 1, a control panel 5 provided with one or more push button sockets 7 adapted to receive and detachably attach any one of said pre-coded push buttons 1. Each push button has a code mechanism adapted to carry a specific code representing a dedicated function for the push button. Each socket of the control panel 5 has a decoding mechanism adapted to generate a code specific control signal based on the code carried by the pre-coded push button when the push button is actuated. A control processor 4 is coupled to the sockets, and adapted to receive the code specific control signal and to activate a predetermined function of the agricultural machine coupled to the specific code. In embodiments, the codes are coupled to specific functions to be controlled in agricultural machines and are represented in a look-up table that is stored in a memory accessible by the control processor 4. In an example of a set of pre-coded control buttons each control button is adapted to carry a unique code representing a specific function for a specific machine or machine type. The push button sockets are distributed over the control panel in a manner suitable for an operator to maneuver a connected agricultural machine by means of push buttons place in the push button sockets. Each of the pre-coded push buttons can be placed in any of the sockets and a user is thereby enabled to place the push buttons in a disposition, order or geometry that is suitable for the task at hand and in accordance with the user's preferences.

In a simple embodiment the control panel system 10 comprises a panel with a single socket, the user can select a suitable pre-coded button to insert into the socket and the control panel may thus be configured for controlling a single selected function of an agricultural machine. In another embodiment, the control panel system comprises a control panel with a plurality of sockets. The user can select one or a plurality of different pre-coded push buttons, place them each in an optional socket and the control panel may thus be configured on one hand for controlling a selected set of functions of an agricultural machine and on the other hand with a selected order or geometry of placement of the push buttons.

The configurable control panel can for example be applied to functions of a seed drill and to other types of machines, for example planters (precision seed drills) and machines that are used outside agriculture. It may involve controlling the amount of fertiliser, seed or pesticide metered out, lifting/lowering the entire machine, adjusting different tools or applying seed coulters with different pressures on different parts on a field.

The agricultural industry is usually operating in a rough environment and under rough conditions, and therefore control panels in this context need to be robust. In order to provide a robust and reliable functionality, embodiments of the pre-coded push button are provided with a code mechanism comprising one or more magnets 2 configured in a magnet pattern to form the code. The physical magnet pattern brought by a certain disposition of the one or more magnets 2 achieves a predetermined magnetic field pattern that is readable by a decoding mechanism of the sockets. In embodiments, the decoding mechanism of each socket in the control panel comprises one or more magnetic field sensors 3 adapted to detect the magnet pattern of an attached pre-coded push button when the push button is actuated. The code specific control signal is generated based on the output signals of the magnetic field sensors.

The magnets 2 may be of the same magnetic strength and said magnet pattern is in such embodiments provided by the presence, the absence and/or the orientation of the magnets mounted at predetermined positions of the push button. In other or embodiments, the magnets 2 may be of different magnetic strength and the magnet pattern is then provided by the differences in strength of the magnets 2 mounted at predetermined or selectable positions of the push button. A pre-coded push button 1 with only one single magnet 2 that is arranged at a certain position on the push button may be employed to provide a unique magnet pattern, similarly to a plurality of magnets 2 disposed in a variation of positions to provide one or more unique magnet patterns. The presence/absence, the orientation and the strength of the magnets 2 may thus in isolation or in any combination thereof be used to provide a magnet pattern to form specific codes.

In embodiments, the one or more magnetic field sensors 3 of the decoding mechanism are mounted in the one or more sockets at predetermined positions corresponding to positions of the one or more magnets of the code mechanism in each pre-coded push button when attached to a socket. The one or more magnetic field sensors 3 are arranged to detect the magnetic field of a corresponding magnet of an attached pre-coded push button when the push button is actuated. In some embodiments, the one or more magnetic field sensors are adapted to determine the magnetic field polarity of a corresponding magnet of an attached pre-coded push button. In other embodiments, the one or more magnetic field sensors are adapted to determine the strength of a corresponding magnet of an attached pre-coded push button. Each of the one or more magnetic field sensors is adapted to deliver an electric signal in response to the detection of a magnetic field such that the code carried by the magnet pattern of the push button is transformed into one or more electric signals used to generate the code specific control signal.

The control panel system is in embodiments adapted to generate a code specific control signal in the form of a binary code. A binary code representing the read out code of a pre-coded push button may be generated by means of an ND converter, comprised in or connected to the decoding mechanism of the socket, receiving a high or low electric signal from each of the magnetic field sensors. The output signal from the ND converter may be delivered as code specific control signal in the form of a binary code or binary word to a data bus coupled to the control processor 4. The control processor 4 may be a part of a PLC system then receive the code specific control signal directly on input ports of the PLC control processor. In other embodiments, the control processor may be a central processing unit CPU in a general digital control system and the processor then receive and read out the code specific control signal on a data bus. The control processor 4 in its turn is adapted to control the functions of a currently connected agricultural machine in accordance with a control program and dependent on a received code specific control signal. As mentioned above, the functions associated with specific codes carried by the pre-coded push buttons may be stored in a data memory possibly together with additional associated information or control data, for example identification data for a certain type of machine or push button. The read out codes are typically compared with a plurality of predetermined functions of the agricultural machine and the function corresponding the current code is activated.

To indicate if any magnets of a pre-coded push button have been lost or damaged, resulting in that an incorrect magnetic field pattern is generated, a check sum of the code may be performed by the control processor 4 and compared to the function identified as corresponding to the code. If the check sum is found not to be related to the function associated with the code, a warning message is generated and communicated to the user. Thereby, incorrect execution of a function is avoided.

Figure 2A:
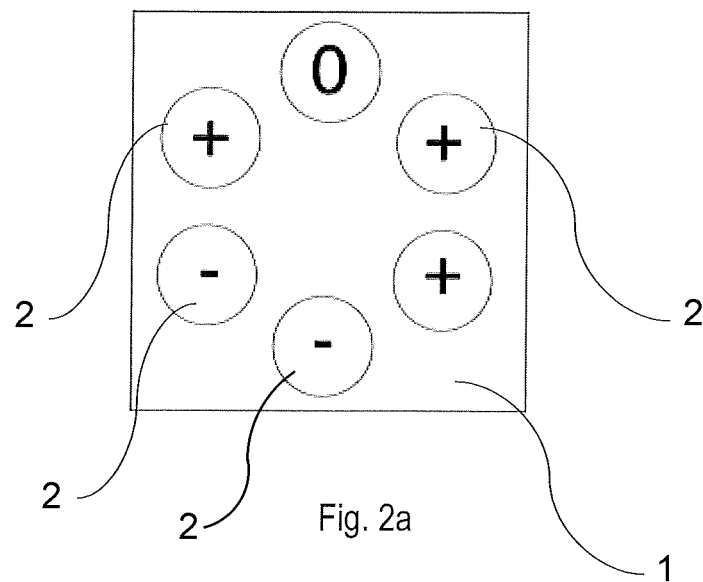
FIGS. 2A and 2B show schematically an exemplifying embodiment of a pre-coded push button in accordance with the present disclosure.
Figure 2B:
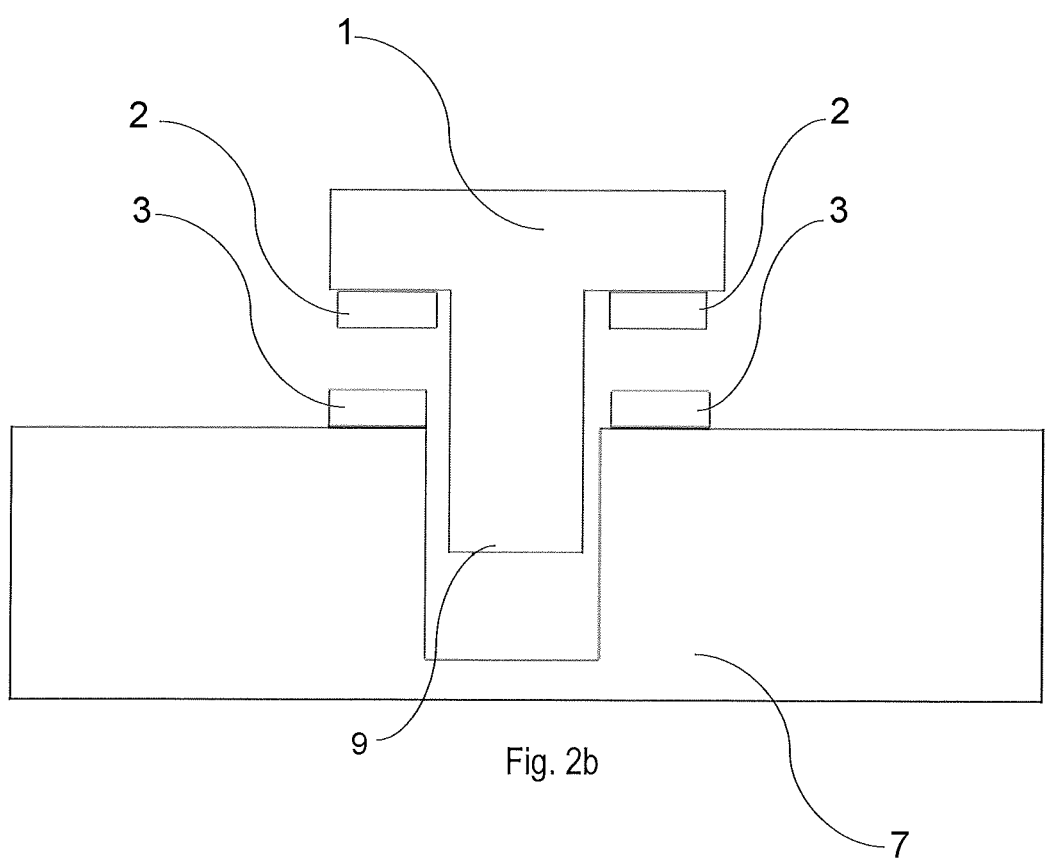

FIGS. 2a and 2b show an exemplifying embodiment of a pre-coded push button 1 and a socket 7 of a configurable control panel for an agricultural machine. The push button 1 is provided with a code mechanism in the form of one or more magnets 2 arranged on the bottom side of the push button in a certain magnet pattern to provide a code. In the embodiment shown in FIG. 2a a plurality of positions for magnets 2 are arranged in a circle, optionally together with a magnetically neutral position 0, on the bottom side of a pre-coded push button 1. The plus (+) sign schematically indicates for example the presence, the orientation, the polarity or the strength of a magnet mounted in that position. Similarly, the minus sign (−) schematically indicates for example the absence, a different orientation, different polarity or a different strength of a magnet at that position.

FIG. 2b shows an embodiment, wherein a pre-coded push button 1 is placed in a socket 7 that is adapted to receive and detachably attach the push button in a socket-push button interface. In FIG. 2a the socket-push button interface is schematically shown as a recess 8 in the socket that is adapted to mate with a corresponding protrusion 9 of a pre-coded push button. The interface further comprises a not shown mechanism for detachably attaching the pre-coded push button to the socket such that it can be safely fastened to the socket and easily detached from the socket when desired, for example in form of snap in mechanism that allows a slide motion of the push button. Also not shown in FIG. 2a is a spring mechanism comprised in or close to the socket devised for holding the push button in and bringing it back to an un-pushed state. One or more magnetic field sensors 3 are mounted at the socket 7 in positions corresponding to those of the magnet pattern of the pre-coded push button such that sensors are arranged to detect the magnetic fields of the magnets and the magnet pattern on the push button when the button is actuated, i.e. pushed into a switching state.

In an alternative embodiment (not shown), the code of the pre-coded push button may be provided by electrical connectors. The push-button is in this embodiment provided with one or more electrical connectors being arranged to provide the code. When the push-button is docketed in a socket, the electrical connectors are brought into electrical contact with corresponding electrical connectors being arranged on the socket. Thereby, one or more electrical circuits will be closed enabling a current to flow. Depending on which of the circuits being closed, the provided code is decoded.

One or more sockets 7 may in different embodiments and applications for example be mounted on a control panel in a driver cab of a tractor or on a portable and/or detachable control panel 5b.

Figure 3A:
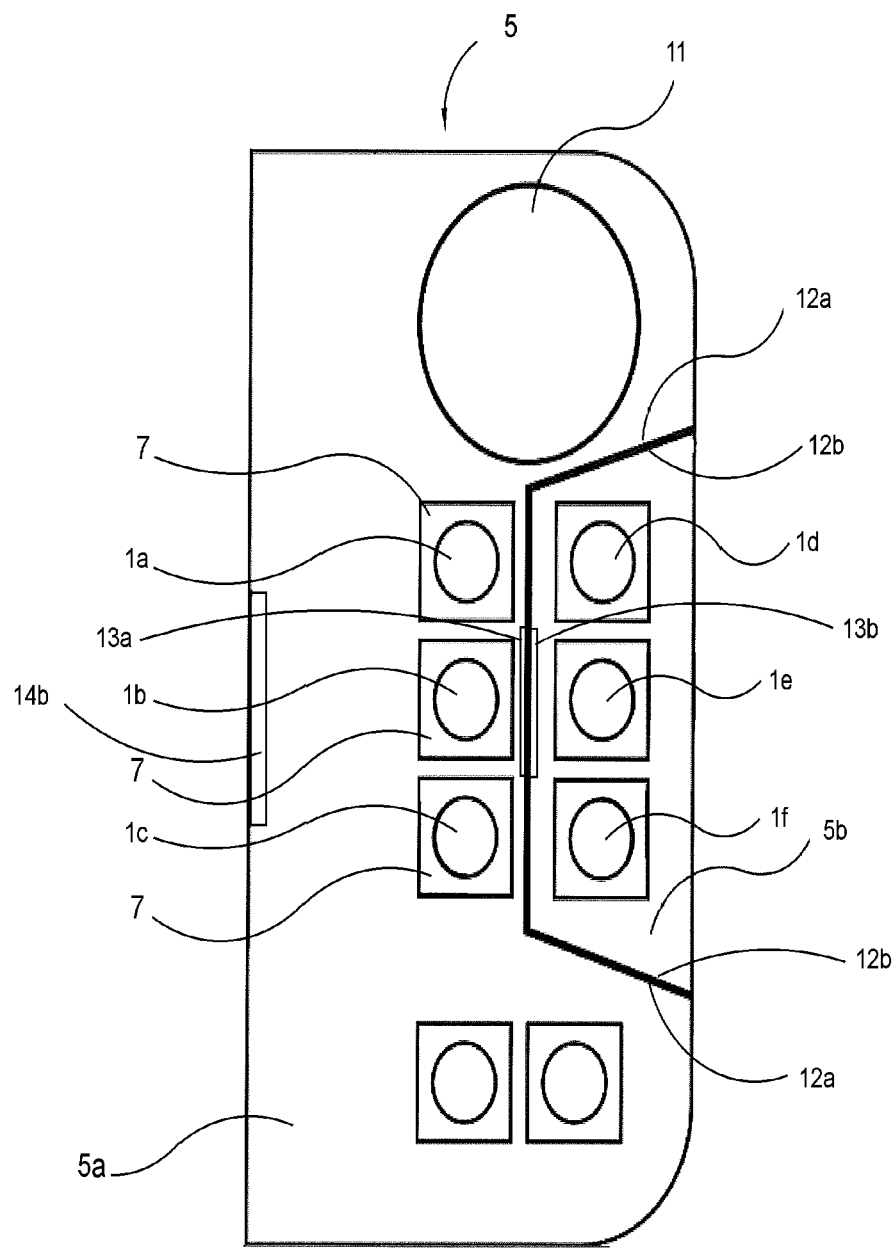
FIGS. 3a and 3b show schematically an exemplifying embodiment of a configurable control panel having a main control panel part and releasable control panel part in accordance with the present disclosure.
Figure 3B:
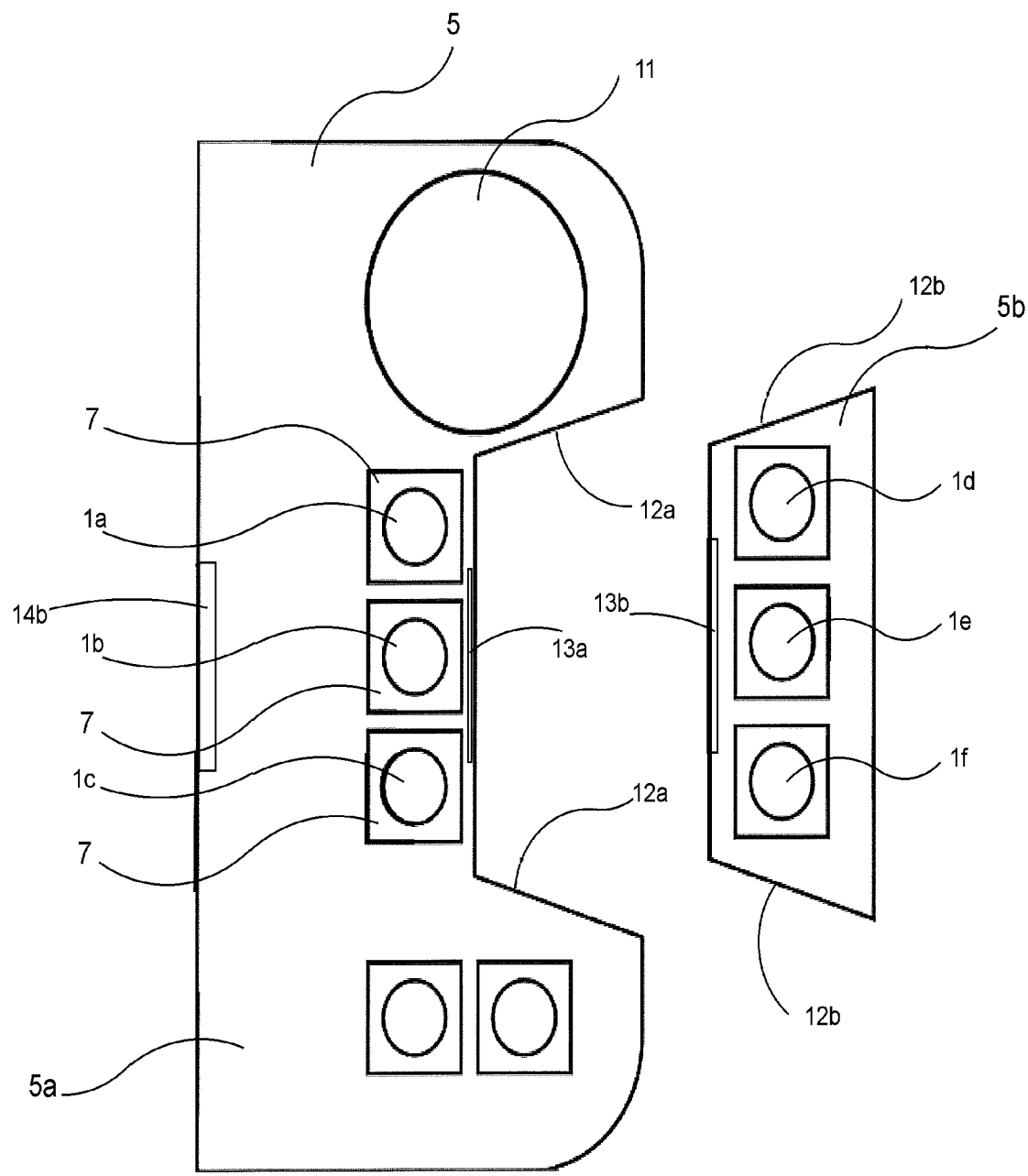

FIGS. 3a and 3b schematically show embodiments of a configurable control panel 5 for an agricultural machine. The control panel 5 comprises a plurality of sockets 7 and a plurality of pre-coded push buttons 1a to 1f attached to the sockets 7 as described above. The control panel 5 in this example further comprises a fixed control actuator 11, for example a safety switch or other generally desired fixed control function. The plurality of push buttons 1a to 1f, each being associated with a function to be activated on the agricultural machine, are all detachable from a respective socket 7 and may be selectively moved and arranged on different locations on the control panel 5. Thereby, a flexible solution is provided that enables the user of the agricultural machine to arrange a plurality of push buttons 1 optimized for the specific agricultural machine, for the specific task or work to be performed, or for the users personal preferences.

The exemplifying embodiment of the control panel 5 comprises a first, main part 5a that for example may be arranged to be fixedly or detachably mounted to other equipment in the driver cab or in the form of a handheld device. A connector 14b provides electrical and/or mechanical connection to other equipment. The control panel 5 further comprises a second, detachable part 5b that in FIG. 3a is shown detachably attached to the first part 5a. A pair of connectors 13a on the main part 5a, and 13b on the detachable part 5b provides electrical and/or mechanical connection between said parts when attached and wired or wireless signal communication between said parts when detached. The wireless signal communication may for example be in the form of radio frequency communication such as BlueTooth or infrared light based communication. The second part 5b may for example be mechanically attached to the first part 5a by means of a snap function, a shape locking function schematically shown as geometrically fitting features 12a and 12b on the respective parts. Combinations of the described and/or other suitable attaching mechanism are conceivable in different embodiments. In different embodiments, both of or only one of the parts 5a and 5b is provided with one or more sockets 7 for receiving a pre-coded push button. For example, as in one embodiment, the main part 5a may be provided with fixed control buttons and the detachable part 5b may be provided with sockets for pre-coded push buttons. Other embodiments of the control panel 5 is formed as a single part with sockets for receiving pre-coded push buttons.

An embodiment comprises a set of pre-coded push buttons 1 for a configurable control panel for an agricultural machine. The set comprises a plurality of pre-coded push buttons each having a code mechanism adapted to carry a specific code representing a dedicated function for the push button and being adapted to detachably attach to any one of one or more sockets 7 of a control panel 5.

FIG. 3b shows the control panel 5 when the main part 5a and the detachable part 5b are detached from each other. The detachable part 5b of the control panel 5 may, when detached, be used by the driver standing outside the driver cab. This may be advantageous for some specific functions to be executed, where the driver may overview the maneuver of the machine better from the outside than from the inside of the driver cab. However, due to safety reasons not all functions are suitable to be executed when the driver is located on the ground and not inside the driver cab. Therefore, for functions associated with push buttons 1 being arranged o the detachable part 5b, some are only available for execution when the detachable part is docketed in the first part 5a of the control panel. This safety function may be achieved such that the first part is fixedly mounted in the driver cab, and that the control processor 4 receives a signal indicating if the detachable part 5a is docketed or not to the first part 5a of the control panel 5. An identified function associated with a pre-coded push button 1 arranged on the detachable part 5b of the control panel 5 will be compared by the control processor 4 with functions conditioned to be executed only from the driver cab. If such a conditioned function is identified, the function will only be executed if the control processor 4 has received a signal indicating that the detachable part 5a is docketed into the first part 5a of the control panel 5.

When a user of the agricultural machine is to perform a working session, a suitable set of desired push buttons 1 related to desired functions are selected by the user in accordance with the task to be performed. Thanks to that the functions are related to the push buttons per se, and not to the location of the push button, the user may arrange the set of push buttons 1 as desired on the control panel 5. The set of push buttons 1 are docketed by the user in a respective base part 7 arranged on the control panel 5. The user may thus arrange push buttons 1 related to functions preferably executed when standing outside the machine on the detachable part 5b of the control panel 5, and push buttons 1 related to functions that needs to be performed when the user is located inside the driver cab on the first part 5a of the control panel 5. Further, if some specific function often is executed both when the user is inside or outside the driver cab, such push buttons may be arranged both on the first part 5a and on the detachable part 5b of the control panel 5. Thereby, the user is provided with a flexible solution enabling the user to set up any set of push buttons 1 as desired.

Figure 4:
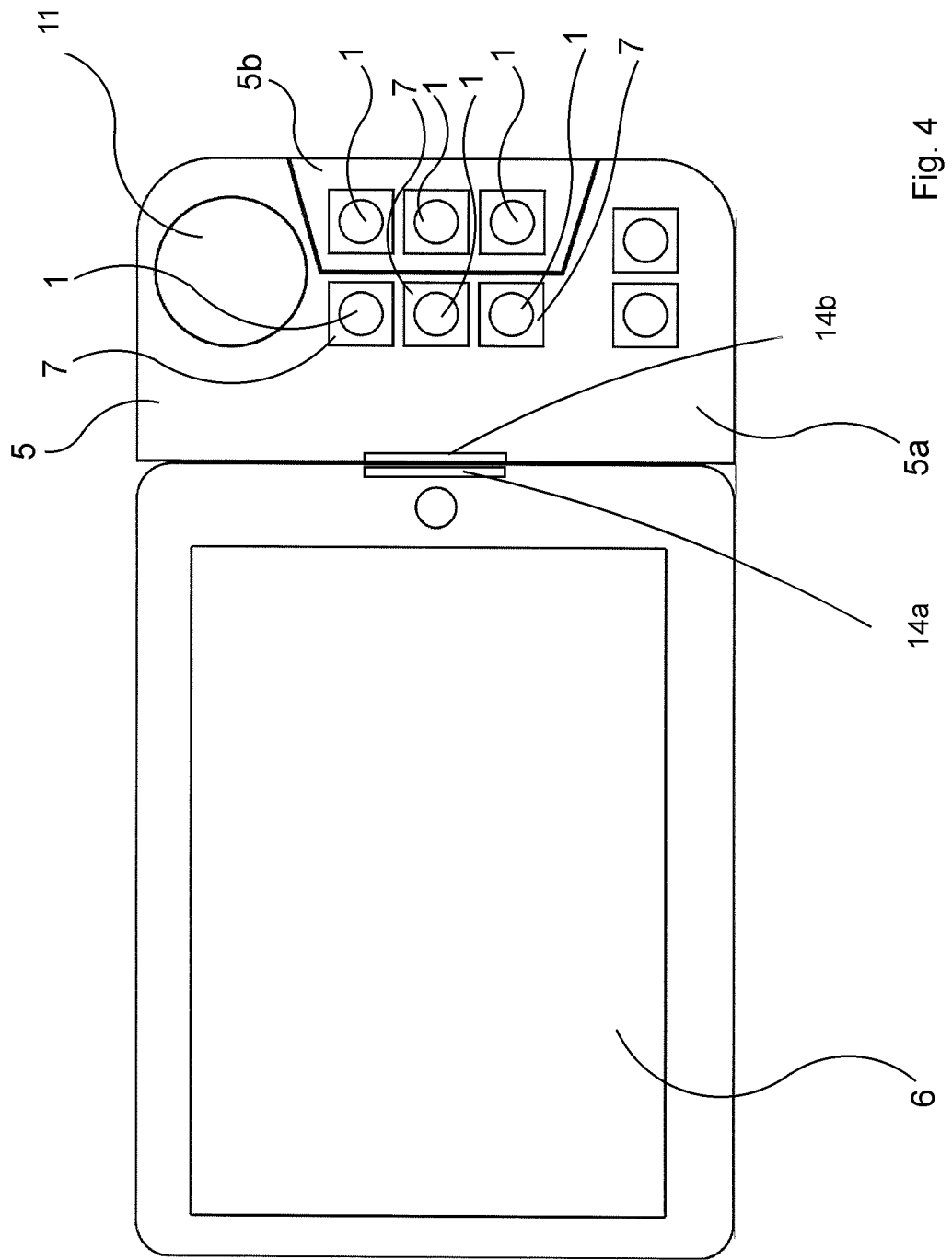
FIG. 4 shows schematically a use case with an exemplifying embodiment of a configurable control panel being coupled to a handheld electronic device in accordance with the present disclosure.

FIG. 4 schematically shows a handheld electronic device 6, with a control panel 5 as described above attached thereto. The handheld device 6 may for example be an android based handheld computer or an Ipad, or any other suitable handheld device. The handheld device 6 may be placed in the driver cab of an agricultural machine by use of a holder into which the device 6 may be docketed. The device 6 may be docketed with or without the control panel 5 attached thereto. The electronic device 6 and the control panel 5 may be arranged to communicate with each other via a pair of connectors 14a and 14b. As an example, when a push button 1 on the control panel 5 is pushed, information of the task executed may be highlighted on the screen of the device 6. Alternatively, a function may be executed by the use of a touch control on a touch screen of the device 6. It is to be noted that the device 6 may be docketed into a holder located in the driver cab or used standing alone. Further, the control panel 5 may be attached as a whole to the device 6, or the first part 5a may be attached while the detachable part 5b may be detached. An electrical circuit arranged via the connectors 13a/13b and/or 14a/14b may be used to determine whether or not the control panel 5 as a whole, or solely the detachable part 5b, is located outside or inside the driver cab. In line with the safety function described above, prohibiting some functions to be executed when the user is located outside the cab, a signal to the control processor 4 indicating that the current control pushed is located inside the driver cab may thus be provided.

The foregoing disclosure is not intended to limit the present invention to the precise embodiment shown in the figures. It is contemplated that various alternate embodiments and/or modifications to the present invention, whether explicitly described or implied herein, are possible in light of the disclosure. Accordingly, the scope of the invention is defined only by the claims.

The invention claimed is:

1. A configurable control panel system for an agricultural machine, the system comprising:
   one or more pre-coded push buttons, each push button having a code mechanism adapted to carry a specific code representing a dedicated function for the push button;
   a control panel provided with one or more sockets adapted to receive and detachably attach any one of said pre-coded push buttons, each socket having a decoding mechanism adapted to generate a code specific control signal based on the code carried by the pre-coded push button when the push button is actuated, wherein the code mechanism of each pre-coded push button comprises one or more magnets configured in a magnet pattern to form said specific code;
   the decoding mechanism of each socket in the control panel comprises one or more magnetic field sensors adapted to detect the magnet pattern of an attached pre-coded push button when the push button is actuated; and
   the code specific control signal is generated based on the output signals of said magnetic field sensors;
   wherein:
      the agricultural machine is arranged to be towed by a towing vehicle such as a tractor;
      the control panel comprises a first part and a second part that is provided with the one or more sockets for the one or more pre-coded push buttons;
      the second part is detachable from the first part;
      the first part and the second part are adapted for wireless or wired communication when detached from each other; and
      the control panel system is arranged to determine whether the second part is located outside or inside a driver cab associated with the agricultural machine.

2. The configurable control panel system of claim 1, further comprising:
   a control processor adapted to receive the code specific control signal and to activate a predetermined function of the agricultural machine coupled to the specific code.

3. The configurable control panel system of claim 1, wherein said magnets are of the same magnetic strength and said magnet pattern is provided by the presence, the absence and/or the orientation of the magnets mounted at predetermined positions of the push button.

4. The configurable control panel system of claim 1, wherein said magnets are of different magnetic strength and said magnet pattern is provided by the differences in strength of the magnets mounted at predetermined or selectable positions of the push button.

5. The configurable control panel system of claim 1, wherein:
   said one or more magnetic field sensors of the decoding mechanism are mounted in the one or more sockets at predetermined positions corresponding to positions of the one or more magnets of the code mechanism in each pre-coded push button when attached to a socket; and
   said one or more magnetic field sensors are arranged to detect the magnetic field of a corresponding magnet of an attached pre-coded push button when the push button is actuated.

6. The configurable control panel system of claim 1, wherein each of said one or more magnetic field sensors is adapted to deliver an electric signal in response to the detection of a magnetic field such that the code carried by the magnet pattern of the push button is transformed into one or more electric signals used to generate said code specific control signal.

7. The configurable control panel system of claim 1, wherein:
   the control panel comprises a first part and a second part that is provided with one or more of said sockets for pre-coded push buttons;
   said second part is detachable from the first part; and the first part and the second part are adapted for wireless or wired communication when detached from each other.

8. The configurable control panel system of claim 1, being adapted to generate a code specific control signal in the form of a binary code.

9. The configurable control panel system claim 1, wherein said one or more magnetic field sensors is adapted to determine the magnetic field polarity of a corresponding magnet of an attached pre-coded push button; or
to determine the strength of a corresponding magnet of an attached pre-coded push button.

10. A pre-coded push button for a configurable control panel for an agricultural machine, comprising a code mechanism adapted to carry a specific code representing a dedicated function for the push button; and
being adapted to detachably attach to any one of one or more sockets of a control panel, wherein the code mechanism comprises one or more magnets configured in a magnet pattern to form said specific code,
wherein:
the agricultural machine is arranged to be towed by a towing vehicle such as a tractor;
the control panel comprises a first part and a second part that is provided with the one or more sockets for the pre-coded push button;
the second part is detachable from the first part;
the first part and the second part are adapted for wireless or wired communication when detached from each other; and
the control panel system is arranged to determine whether the second part is located outside or inside a driver cab associated with the agricultural machine.

11. The pre-coded push button of claim 10, wherein said magnets are of the same magnetic strength and said magnet pattern is provided by the presence, the absence and/or the orientation of the magnets mounted at predetermined positions of the push button.

12. The pre-coded push button of claim 10, wherein said magnets are of different magnetic strength and said magnet pattern is provided by the differences in strength of the magnets mounted at predetermined or selectable positions of the push button.

13. A set of pre-coded push buttons for a configurable control panel for an agricultural machine, comprising a plurality of pre-coded push buttons each having a code mechanism adapted to carry a specific code representing a dedicated function for the push button and being adapted to detachably attach to any one of one or more sockets of a control panel, wherein each push button comprises the features and functions according to claim 11 and the agricultural machine is arranged to be towed by a towing vehicle such as a tractor.

14. The set of pre-coded push buttons of claim 13, wherein each of said pre-coded push buttons is provided with a unique code within the set and wherein each respective code is coupled to a unique function to be activated on the agricultural machine when the push button is actuated.

15. A configurable control panel for an agricultural machine, comprising one or more sockets each adapted to receive and detachably attach a pre-coded push button, each socket having a decoding mechanism adapted to generate a code specific control signal based on the code carried by the pre-coded push button when the push button is actuated, wherein the decoding mechanism of each socket in the control panel comprises one or more magnetic field sensors adapted to detect the magnet pattern of an attached pre-coded push button when the push button is actuated; the code specific control signal is generated based on the output signals of said magnetic field sensors;
wherein:
the agricultural machine is arranged to be towed by a towing vehicle such as a tractor;
the control panel comprises a first part and a second part that is provided with the one or more sockets for the pre-coded push button;
the second part is detachable from the first part;
the first part and the second part are adapted for wireless or wired communication when detached from each other; and
the control panel system is arranged to determine whether the second part is located outside or inside a driver cab associated with the agricultural machine.

16. The configurable control panel of claim 15, comprising a control processor adapted to receive the code specific control signal and to activate a predetermined function of the agricultural machine coupled to the specific code.

17. The configurable control panel of claim 15, wherein: said one or more magnetic field sensors of the decoding mechanism are mounted in the one or more sockets at predetermined positions corresponding to positions of the one or more magnets of the code mechanism in each pre-coded push button when attached to a socket; and
said one or more magnetic field sensors are arranged to detect the magnetic field of a corresponding magnet of an attached pre-coded push button when the push button is actuated.

18. The configurable control panel of claim 15, wherein each of said one or more magnetic field sensors is adapted to deliver an electric signal in response to the detection of a magnetic field such that the code carried by the magnet pattern of the push button is transformed into one or more electric signals used to generate said code specific control signal.

19. The configurable control panel of claim 15, wherein:
the control panel comprises a first part and a second part that is provided with one or more of said sockets for pre-coded push buttons;
said second part is detachable from the first part; and
the first part and the second part are adapted for wireless or wired communication when detached from each other.

20. The configurable control panel of claim 15, being adapted to generate a code specific control signal in the form of a binary code.

* * * * *